United States Patent
Lin et al.

(10) Patent No.: US 11,048,439 B2
(45) Date of Patent: Jun. 29, 2021

(54) DEVICE OF MEMORY MODULES

(71) Applicant: EOREX CORPORATION, Hsinchu County (TW)

(72) Inventors: Cheng-Lung Lin, Hsinchu County (TW); Wan-Tung Liang, Hsinchu County (TW)

(73) Assignee: EOREX CORPORATION, Hsinchu County (TW)

( * ) Notice: Subject to any disclaimer, the term of this patent is extended or adjusted under 35 U.S.C. 154(b) by 42 days.

(21) Appl. No.: 16/448,557

(22) Filed: Jun. 21, 2019

(65) Prior Publication Data
US 2020/0401342 A1    Dec. 24, 2020

(51) Int. Cl.
*G06F 3/06* (2006.01)
*H05K 1/18* (2006.01)

(52) U.S. Cl.
CPC .......... *G06F 3/0659* (2013.01); *G06F 3/0604* (2013.01); *G06F 3/0673* (2013.01); *H05K 1/181* (2013.01); *H05K 2201/10022* (2013.01); *H05K 2201/10159* (2013.01); *H05K 2201/10287* (2013.01); *H05K 2201/10522* (2013.01)

(58) Field of Classification Search
CPC .................................................... G06F 3/0659
See application file for complete search history.

(56) References Cited

U.S. PATENT DOCUMENTS

| | | | | |
|---|---|---|---|---|
| 6,947,304 B1* | 9/2005 | Yen | ........................... | G11C 5/04 365/189.05 |
| 10,169,258 B2* | 1/2019 | Yeung | ................... | G06F 13/1673 |
| 2003/0061447 A1* | 3/2003 | Perego | ....................... | G11C 7/10 711/131 |
| 2004/0257847 A1* | 12/2004 | Matsui | ................... | G11C 7/1051 365/63 |
| 2005/0134304 A1* | 6/2005 | Lee | ....................... | H04L 25/0278 326/30 |
| 2005/0139978 A1* | 6/2005 | Hirose | ................. | H01L 25/0657 257/686 |
| 2006/0077731 A1* | 4/2006 | Ware | ..................... | G11C 7/1048 365/194 |
| 2006/0107186 A1* | 5/2006 | Cowell | .............. | G11C 29/1201 714/776 |

* cited by examiner

*Primary Examiner* — Douglas King
(74) *Attorney, Agent, or Firm* — Demian K. Jackson; Jackson IPG PLLC

(57) ABSTRACT

A memory device is provided. The device comprises a substrate, a controller, at least a tap, a plurality of memory modules, and at least two resistors. The controller connects to the substrate. The tap, the memory modules, and the resistors are set on the substrate. The tap comprises an input terminal connecting to the controller; a first output terminal; and a second output terminal. After connecting to each other in series, the memory modules connect to the first output terminal and the second output terminal. Each of the resistors connects to one of the memory modules which connect to the first output terminal and the second output terminal. Thus, command signals, address signals, and timing signals are separately sent to the memory modules through the first output terminal and the second output terminal of the tap simultaneously to process instruction or read information by the controller.

2 Claims, 3 Drawing Sheets

DEVICE OF MEMORY MODULES

TECHNICAL FIELD OF THE INVENTION

The present invention relates to a memory device; more particularly, to shortening the read path of a controller with fast read and enhanced performance of use.

DESCRIPTION OF THE RELATED ART

A general memory device (e.g.: DDR4) comprises a controller; a plurality of memory modules connecting to the controller; and a resistor connecting to one of the memory modules.

Take a controller reading the memory modules on use as an example, where the memory device has a width of 133.35 mm with 8 memory modules. The controller will sequentially read from the first memory module to the eighth memory module, so that the read path of the controller needs to be 260 mm. Thus, the read path of the controller is long; the read speed is slow; and the performance of the memory device is affected.

Hence, the prior art does not fulfill all users' expectations on actual use.

SUMMARY OF THE INVENTION

The main purpose of the present invention is to separately send command signals, address signals, and timing signals to memory modules through a first output terminal and a second output terminal of a tap simultaneously to process instructions or read data by a controller, where the read path can be shortened for the controller to achieve fast read and enhance the performance of use.

To achieve the above purposes, the present invention is a device of memory modules, comprising at least a substrate; a controller; at least a tap; a plurality of memory modules; and at least two resistors, where the controller connects to the substrate to read and control command signals, address signals, and timing signals; the tap is set on the substrate and connects to the controller; the tap comprises an input terminal connecting to the controller; a first output terminal; and a second output terminal; the tap receives the command signals, address signals, and timing signals of the controller from the input terminal and separately sends out the command signals, address signals, and timing signals through the first output terminal and the second output terminal simultaneously; the memory modules are separately set on the substrate; after a number of a part of the memory modules are separately connected in series with address wires and control wires, one in the part of the memory modules connects to the first output terminal; after a number of the other part of the memory modules are separately connected in series with address wires and control wires, another one in the other part of the memory modules connects to the second output terminal; the memory modules store required instruction and information and separately send the command signals, address signals, and timing signals to the memory modules through the first output terminal and the second output terminal of the tap simultaneously to process instruction and read information by the controller; the resistors are separately set on the substrate; one of the resistors connects to the one of the memory modules which connects to the first output terminal; another one of the resistors connects to the another one of the memory modules which connects to the second output terminal; and the resistors separately absorb reflected signals of the memory modules. Accordingly, a novel device of memory modules is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
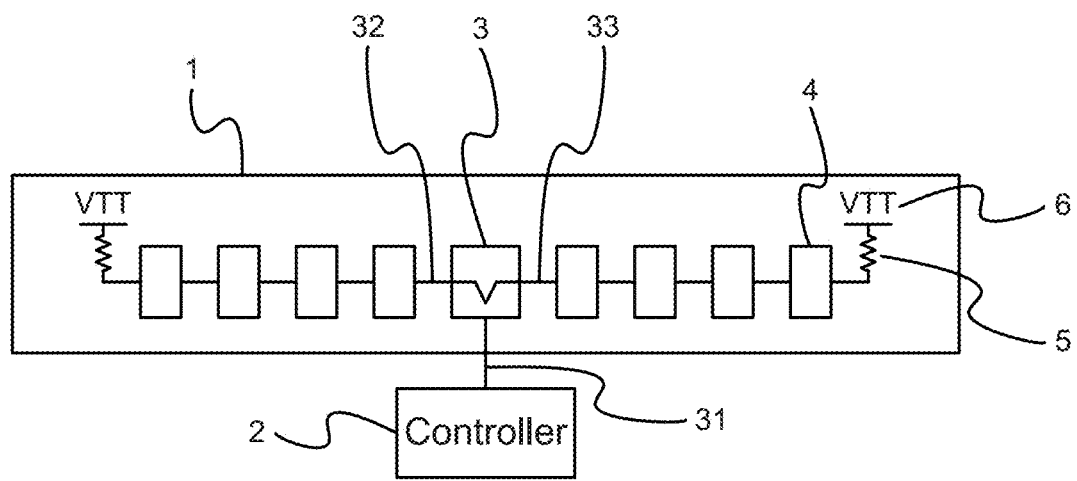
FIG. 1 is the view showing the first preferred embodiment according to the present invention.

Please refer to FIG. 1, which is a view showing a first preferred embodiment according to the present invention. As shown in the figure, the present invention is a device of memory modules, comprising at least a substrate 1, a controller 2, at least a tap 3, a plurality of memory modules 4, and at least two resistors 5.

The substrate 1 is a circuit board.

The controller 2 connects to the substrate 1. The controller 2 is a central processing unit to read and control command signals, address signals, and timing signals.

The tap 3 is set on the substrate 1 and connects to the controller 2. The tap 3 comprises an input terminal 31 connecting to the controller 2; a first output terminal 32; and a second output terminal 33, which receives the command signals, address signals, and timing signals of the controller 2 from the input terminal 31 and separately sends out the command signals, address signals, and timing signals through the first output terminal 32 and the second output terminal 33 simultaneously.

The memory modules 4 are separately set on the substrate 1. After a number of a part of the memory modules 4 are separately connected in series with address wires and control wires, one in the part of the memory modules 4 connects to the first output terminal 32; after a number of the other part of the memory modules 4 are separately connected in series with address wires and control wires, another one in the other part of the memory modules 4 connects to the second output terminal 33; and the memory modules 4 store required instruction and information and separately send the command signals, address signals, and timing signals to the memory modules 4 through the first output terminal 32 and the second output terminal 33 of the tap 3 simultaneously for the controller 2 to process instruction and read data.

The resistors 5 are separately set on the substrate 1, where one of the resistors 5 connects to the one of the memory modules 4 which connects to the first output terminal 32; another one of the resistors 5 connects to the another one of the memory modules 4 which connects to the second output terminal 33; and the resistors 5 absorb reflected signals of the memory modules 4 separately.

On using the present invention, the controller 2 outputs the command signals, address signals, and timing signals to the input terminal 31 of the tap 3; and, then, separately sends the command signals, address signals, and timing signals to the memory modules 4 through the first output terminal 32 and the second output terminal 33 simultaneously for the controller 2 to process instruction or read data. Since the controller 2 processes instruction and reads information from the memory modules 4 through the first output terminal 32 and the second output terminal 33 of the tap 3 (I.e., to read through two routes simultaneously), paths for reading are shortened for the controller 2 to achieve fast read and enhance the performance of use.

In a state-of-use, ones of the memory modules 4 which connect to the first output terminal 32 are set at a side of the substrate 1, whose number is at least 4; and another ones of the memory modules 4 which connect to the second output terminal 33 are set at another side of the substrate 1, whose number is at least 4. Thus, concerning a memory device having a length of 133.35 millimeters (mm) where the command signals, address signals, and timing signals are separately sent to the memory modules 4 through the first output terminal 32 and the second output terminal 33 simultaneously as the tap 3 receives the command signals, address signals, and timing signals of the controller 2 from the input terminal 31 (I.e., to read through two routes simultaneously), the path for reading instruction and information by each of the memory modules 4 has a width of 80 mm so that the path for the controller 2 is shortened to achieve fast read and enhance the performance of use.

In a state-of-use, each of the resistors 5 connects to a terminal voltage (VTT) 6. Thus, stabilized voltage is outputted to the memory modules 4 to maintain normal operations of the memory modules 4.

Figure 2:
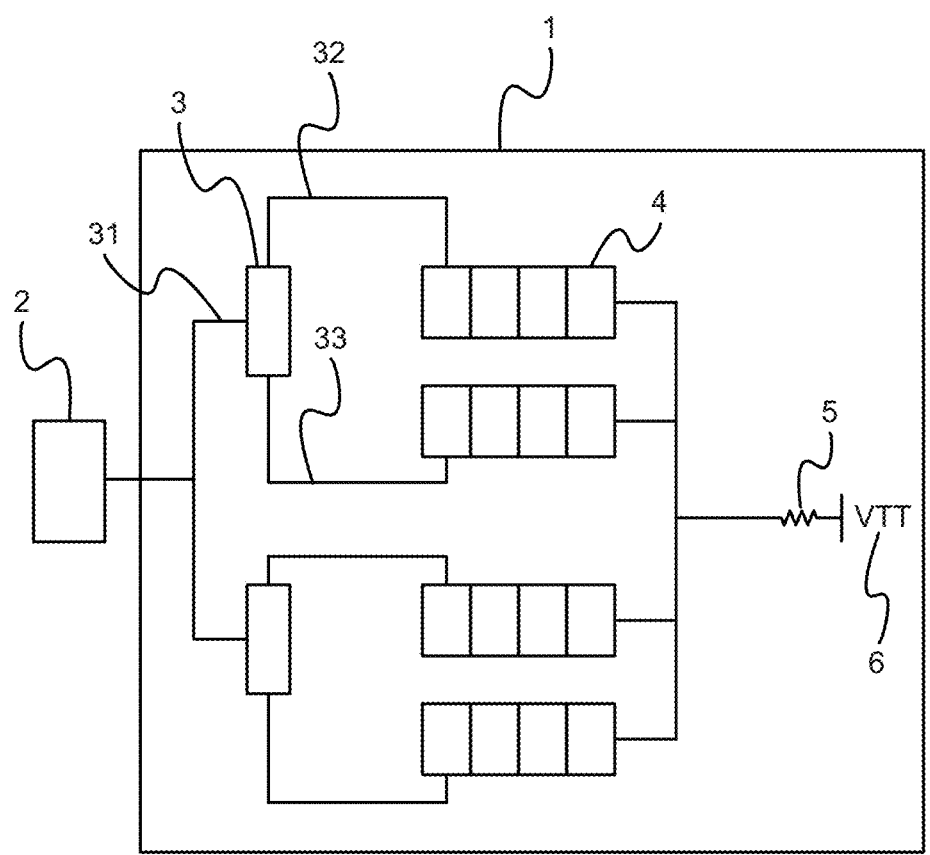
FIG. 2 is the view showing the second preferred embodiment.

Please refer to FIG. 2, which is a view showing a second preferred embodiment. As shown in the figure, at least 4 memory modules 4 are grouped into a set and a plurality of the sets are set on a substrate 1 in a top-down arrangement. Thus, different needs are met while the read path of a controller 2 is shortened with fast read and enhanced performance of use.

Figure 3:
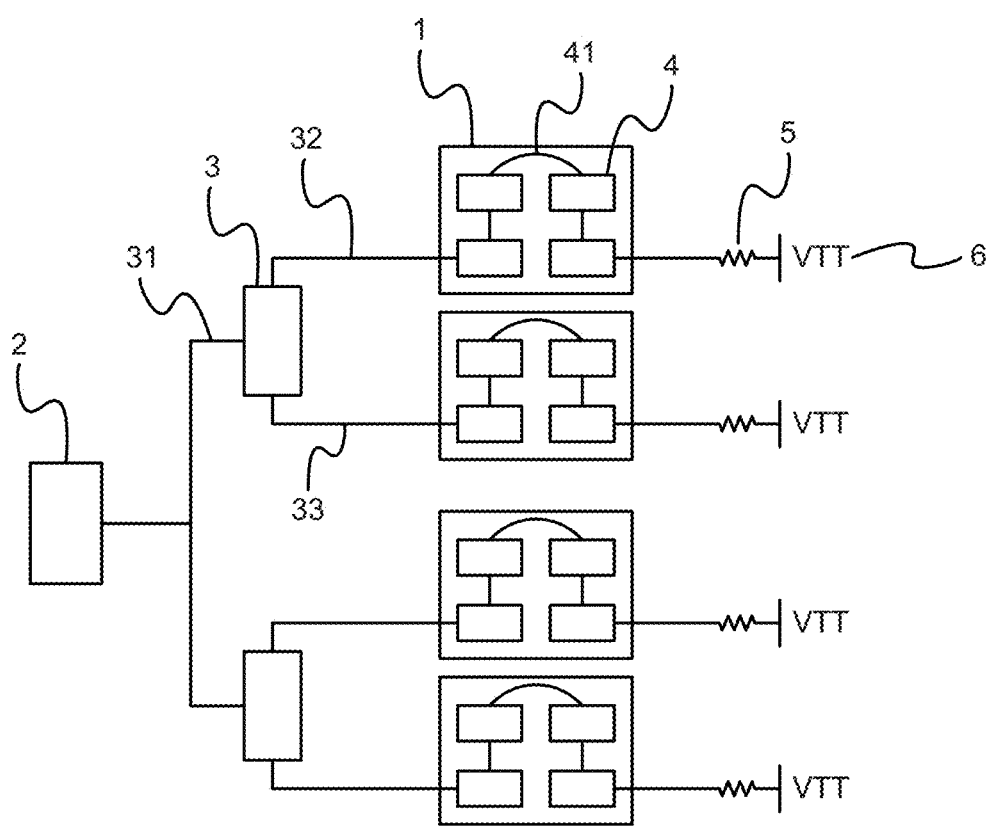
FIG. 3 is the view showing the third preferred embodiment.

Please refer to FIG. 3, which is a view showing a third preferred embodiment. As shown in the figure, a plurality of substrates 1 are each separately set with at least 4 memory modules. The memory modules 4 on each of the substrates 1 have a square-matrix arrangement and connect to each other with Ω-shaped wires 41; and the substrates 1 are stacked (not shown in the figure). Thus, different needs are met while the read path of a controller 2 is shortened with fast read and enhanced performance of use.

To sum up, the present invention is a device of memory modules, where command signals, address signals, or timing signals are separately sent to memory modules through a first output terminal and a second output terminal of a tap simultaneously to process instruction or read data by a controller; and a read path is shortened for the controller to achieve fast read and enhance the performance of use.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A device of memory modules comprising:
a substrate;
a central processing unit (CPU) connected to said substrate and configured to read and to control command signals, address signals, and timing signals;
two taps disposed on said substrate and connected to said CPU, each tap comprising an input terminal connected to the CPU, a first output terminal, and a second output terminal, wherein each tap is configured to receive said command signals, address signals, and timing signals of said CPU from said input terminal and separately send out said command signals, address signals, and timing signals through said first output terminal and said second output terminal simultaneously;
a plurality of sets of 4 memory modules disposed on said substrate in a top-down arrangement, wherein each set of memory modules is separately disposed on said substrate, first sets of said memory modules separately connected in series with address wires and control wires to a respective first output terminal and second sets of said memory modules separately connected in series with address wires and control wires to a respective second output terminal, wherein said memory modules are configured to store information and to be separately sent said command signals, address signals, and timing signals through said first respective output terminal or said respective second output terminal of said taps simultaneously and are configured to to process instruction and read information by said CPU; and
a resistor separately disposed on said substrate and connected to a terminal voltage and to each first and each second output terminal and wherein the resistor is configured to absorb reflected signals of said memory modules.

2. A memory module device comprising:
a central processing unit (CPU) configured to read and to send command signals, address signals, and timing signals;
2 taps each connected to the CPU and comprising:
an input terminal connected to the CPU and configured to receive the command signals, address signals, and timing signals;
a first output terminal; and
a second output terminal, wherein each tap is configured to send the command signals, address signals, and timing signals through the first output terminal and the second output terminal simultaneously;
4 stacked substrates; and
4 memory modules disposed on each substrate in a square-matrix arrangement and separately connected in series with address wires and control wires to a respective first or second output terminal in an alternating configuration and wherein the memory modules are configured to store information and to be separately sent the command signals, address signals, and timing signals through the respective first or second output terminal simultaneously and to process instruction and read information by the CPU; and
four resistors each connected to a terminal voltage and to one memory module of each substrate and configured to absorb reflected signals.

* * * * *